US008025837B2

(12) United States Patent  
Richardson et al.

(10) Patent No.: US 8,025,837 B2
(45) Date of Patent: Sep. 27, 2011

(54) GENERATOR FOR FLUX SPECIFIC BURSTS ON NANO-PARTICLES

(75) Inventors: Martin Richardson, Geneva, FL (US); Kazutoshi Takenoshita, Oveida, FL (US); Chiew-Seng Koay, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 17 days.

(21) Appl. No.: 11/986,057

(22) Filed: Nov. 20, 2007

(65) Prior Publication Data

US 2008/0142738 A1 Jun. 19, 2008

Related U.S. Application Data

(62) Division of application No. 10/982,272, filed on Nov. 5, 2004, now Pat. No. 7,361,204.

(60) Provisional application No. 60/517,718, filed on Nov. 5, 2003.

(51) Int. Cl.
*C21C 1/00* (2006.01)

(52) U.S. Cl. ........................................... 266/202

(58) Field of Classification Search .................. 266/202
See application file for complete search history.

(56) References Cited

U.S. PATENT DOCUMENTS

| 4,182,574 | A | 1/1980 | Quillfeldt |
|---|---|---|---|
| 5,459,771 | A | 10/1995 | Richardson |
| 5,577,091 | A | 11/1996 | Richardson |
| 5,577,092 | A | 11/1996 | Kublak et al. |
| 6,200,674 | B1 | 3/2001 | Kumar |
| 6,285,743 | B1 | 9/2001 | Kondo |
| 6,304,630 | B1 | 10/2001 | Bisschops et al. |
| 6,377,651 | B1 | 4/2002 | Richardson et al. |
| 6,493,423 | B1 | 12/2002 | Bisschops |
| 2002/0015473 | A1 | 2/2002 | Hertz |
| 2002/0044629 | A1 | 4/2002 | Hertz |
| 2002/0070353 | A1 | 6/2002 | Richardson |
| 2002/0075126 | A1 | 6/2002 | Reitz et al. |
| 2002/0090054 | A1 | 7/2002 | Sogard |
| 2002/0141536 | A1 | 10/2002 | Richardson |
| 2003/0108155 | A1 | 6/2003 | Wilkins |
| 2004/0170252 | A1 | 9/2004 | Richardson |
| 2004/0208286 | A1 | 10/2004 | Richardson |
| 2005/0287308 | A1 | 12/2005 | Becker et al. |
| 2006/0049547 | A1 | 3/2006 | Khang |
| 2008/0142738 | A1* | 6/2008 | Richardson et al. ....... 250/492.1 |

FOREIGN PATENT DOCUMENTS

WO    WO 01/08795 A1    6/2000

* cited by examiner

*Primary Examiner* — Scott Kastler
(74) *Attorney, Agent, or Firm* — Brian S. Steinberger; Phyllis K. Wood; Law Offices of Brian S. Steinberger, P.A.

(57) ABSTRACT

Methods, systems and apparatus for producing a variable, known number of nanoparticles of various materials in an expanding mist in a vacuum or enclosure. The configurations allow for this mist of small particles to be produced in bursts, at repetition rates over a wide range of frequencies. The technique produces an isotropically expanding mist of particles. Direct applications of the invention can be used for the development of high power short wavelength incoherent light sources for applications in EUV lithography (EUVL), advanced microscopy, precision metrology, and other fields.

3 Claims, 6 Drawing Sheets

GENERATOR FOR FLUX SPECIFIC BURSTS ON NANO-PARTICLES

This is a Divisional of application Ser. No. 10/982,272 filed Nov. 5, 2004 now U.S. Pat. No. 7,361,204 which claims the benefit of priority to U.S. Provisional Patent Application 60/517,718 filed Nov. 5, 2003.

FIELD OF THE INVENTION

This invention relates to generating nanoparticles and more specifically to methods, systems and devices for generating flux-specific bursts of nanoparticles for different applications.

BACKGROUND AND PRIOR ART

EUVL (extreme ultraviolet lithographys) is expected to succeed Deep UV (ultraviolet) lithography technology for the production of silicon-based computer chips, at and beyond the 35 nm node. This technology is expected to take over fabrication in the 2007-2009 time frame. The stepper machines that print these chips are expected to cost $20-40M each, and, in this time frame, anticipated sales of 200-300 units/year are expected, providing the three major stepper manufacturing companies, ASML (Netherlands & USA), Nikon and Canon (Japan), with a new $100 B/year market. The light sources for these steppers, are currently required to provide greater than 100 W of 'clean power' and can account for up to 20% of this total market. A source of sufficient power is identified as the principal problem area in the ITRS (SEMATECH) Roadmap for the development of EUVL. The roadmap has been modified periodically over the years to take into account the required increase in wafer throughput, larger (300 mm) wafers, and higher Cost of Ownership (CoO), and the power of the source demanded has progressively increased. Currently the total required emitted power within a solid angle of $2\pi$, from a source of <1 mm in size within a 2% bandwidth at a wavelength of 13.5 nm, is 400-1000 W. This large amount of power is the major challenge for companies developing the light sources.

There are two primary types of light sources being developed, those that depend on electrical discharge plasma, and those that use a laser-plasma source. Both approaches operate at frequencies in excess of 6 kHz, with pulse-to-pulse stability of approximately 1%. They are also required to be capable of long term operation (up time >95%), and 'clean' operation. By 'clean' operation we mean 'debris-free' or protected from the effects of particulate emission and plasma ions emanating from the source.

Both laser plasmas and discharge plasmas can produce high velocity particulate emission or 'projectiles' that will damage the expensive, precision-coated EUV collection mirrors that are in direct line-of-sight of the source. In laser plasmas, this particulate debris can originate from solid target sources, or close-proximity nozzles used to inject gaseous targets. In discharge sources the debris originates from the electrodes or from insulative materials close by. The plasma ions are, of course, inherent to the plasmas themselves. They need to be stopped from sputtering (ablating) the collection mirrors. Several techniques have been devised to stop the sputtering, including Repeller Field approach disclosed in U.S. Pat. No. 6,377,651 issued to Richardson, et al. on Apr. 23, 2002, which is incorporated by reference.

Companies developing discharge plasmas (DP) are Philips (hollow-cathode discharge), Xtreme Technologies (HC Z-pinch), Cymer (dense plasma focus), PIEX LLC star discharge), EUVA (capillary discharge pinch plasma). Those developing laser plasma (LP) sources are Grumman Technologies (TRW and CEO), Xtreme Technologies, JMAR Research Inc, EUVA (Ushio and Komatzu), Exulite (France), Powerlase (UK) and Innolite (Sweden).

Most of these companies are focusing their R&D activities on Xenon-based plasmas. Those using discharges are injecting gaseous Xenon into the source. Those developing LP sources use either a high-pressure Xe gas spray, which in a vacuum generates Xe nano-particles or 'clusters', or they are using thin (approximately 20 µm diameter) liquid Xe jets as targets.

Although the use of Xenon mitigates, to some extent the debris problem, its principal drawback is low conversion efficiency to in-band, 13.5 nm EUV light. Both DP and LP sources have been limited to conversion efficiencies (CE) of 0.5-0.7%. The highest CE recorded so far has been 0.95%. Moreover, there are now solid, atomic physics, reasons to believe that the CE of Xenon will not improve much beyond these values. These low CE's have adverse implications for both DP and LP sources. For LP sources it means the use of laser systems having a power in excess 40 kW, beyond current technical capabilities and possibly prohibitively expensive. For DP sources, the low CE poses extreme problems with heat removal from the source and very large electrical power requirements (approaching 1 MW).

The present invention advances the art by inclusion of a method, apparatus and system for generating a known number of nanoparticles of various substances, from a material-specific source, irradiated by a low power pulse laser source. There are a wide number of possible applications for use of the novel method, apparatus and system, ranging from pulse laser deposition (PLD) techniques to the generation of small numbers of nanoparticles across a specific area for biological or biochemical applications. We cite ere one specific application of this generator, as a component in a system for high-power short wavelength incoherent light sources for applications in EUV lithography, advanced microscopy and precision metrology.

SUMMARY OF THE INVENTION

The first objective of the present invention is to provide a method, apparatus and system for generating a cloud or bursts of nano-droplets or nanoparticles from a laser light source interacting with a small microparticle or micro-droplet (a micro-target) of material.

The second objective of the present invention is to provide a method, apparatus and system for generating a known flux of nano-droplets or nanoparticles of various substances.

The third objective of the present invention is to provide a method, apparatus and system for generating a cloud or bursts of nano-droplets or nanoparticles for use in EUV lithography.

The fourth objective of the present invention is to provide a method, apparatus and system for generating a cloud or bursts of nano-droplets or nanoparticles for use advanced microscopy.

The fifth objective of this invention is to provide a method, apparatus and system for generating a cloud or bursts of nano-droplets or nanoparticles for use in precision metrology.

The method, apparatus and system of the present invention generates a known umber of nano-droplets or nanoparticles of various substances, from a material-specific source, irradiated by a low power light source. A stream of micro-targets are dispensed from a source and the light source is focused on the micro-targets, heating the micro-target to generate a flux-specific bursts of nano-droplets or nanoparticles, dependent on the size of the micro-target and the repetition rate of the irradiation process.

In an embodiment, the nano-droplets or nanoparticles pass through an environment, such as a partial vacuum, a gas curtain or a gas enclosure to cool the nano-droplets or nanoparticles to a temperature below their melting temperature, then a simple plate collector can be used to collect and sort the nanoparticles.

The novel method, apparatus and system may be used for pulse laser deposition (PLD) techniques, generating a numbers of nanoparticles across a specific area for biological or biochemical applications and for high-power short wavelength incoherent light source for applications in EUV lithography, advanced microscopy and precision metrology.

The invention can include a method, apparatus, and system for generating nanoparticles from a single microparticle, that includes dispensing a target stream of microparticles of material from a source, focusing a light source onto the target stream, heating the target stream with the light source, and generating flux-specific bursts of nanoparticles from the heated target stream.

The microparticles can include at least two basic constituents, a nanoparticle material (NPM) and an evaporant. The NPM can be a metal with a low melting point. The NPM can be a non metal with a relatively high melting point. The NPM can also be selected from Lithium, Aluminum, Antimony, Arsenic, Astatine, Barium, Bismuth, Cadmium, Calcium, Cerium, Cesium, Copper, Gallium, Germanium, Gold, Indium, Lanthanum, Lead, Magnesium, Plutonium, Plutonium, Potassium, Praseodymium, Radium, Rubidium, Selenium, Silver, Sodium, Strontium, Sulphur, Tellurium, Thallium, in, Ytterbium, and Zinc.

The evaporant can be a liquid such as water, alcohol, methane, any liquid with a low boiling point, and any low boiling point material that is chemically attached to the NPM (such as Chlorine, Fluorine, Oxides).

The generated nanoparticles are nano-droplets, and the invention can include converting the nano-droplets to solid nanoparticles. The converting can include cooling the nano-droplets to below a melting point.

Cooling can include passing the nano-droplets through an environment selected from one of: a partial vacuum, a gas curtain, and a gas enclosure. And the solid nanoparticles can be collected on a collector plate.

The microparticles include a size varying from approximately 1 micron diameter to approximately 500 microns in diameter. The light source can be a laser source.

Heating can include raising temperature of the target-stream above a boiling point of the evaporant and below that of the NPM. The heating can occur over a time of approximately picoseconds to approximately microseconds.

The microparticles in the target stream can include a predetermined diameter and the light source includes sufficient energy to cause the evaporant within the target stream to undergo fast evaporation under superheating, and the microparticles in the target stream include a diameter of approximately 30 microns and energy from the light source is approximately 1 µJ (micro joules).

The nanoparticle generator can be used as a target material source for high-power short wavelength incoherent light sources. The nanoparticle generator can be used as a target material source for EUV lithography. The nanoparticle generator can be used as a target material source for advanced microscopy. The nanoparticle generator can be used as a target material source for precision metrology.

The invention can include varying at least one of a size of the microparticle and a repetition rate of the light source to control the flux of nanoparticles generated.

Further objects and advantages of this invention will be apparent from the following detailed description of the presently preferred embodiments which are illustrated schematically in the accompanying drawings.

DESCRIPTION OF THE PREFERRED EMBODIMENTS

Before explaining the disclosed embodiment of the present invention in detail it is to be understood that the invention is not limited in its applications to the details of the particular arrangement shown since the invention is capable of other embodiments. Also, the terminology used herein is for the purpose of description and not of limitation.

The invention involves the use of a modest, low power laser to transform a small pellet or droplet, referred to as a micro-target, of material, of known mass, into a cloud of nano-droplets or nanoparticles. The micro-target material is composed of at least two materials, that are categorized as either an evaporant or an nano-particle material (NPM). Typical NPMs include any metal, particularly metals with low melting points, such as Copper, Zinc, Lead, Tin, Silver, Antimony, Gold, Aluminum Lithium, etc, or a non-metal with a relatively high melting point. A list of some possible NPMs is included in Table 1.

Typical evaporants might be any liquid such as water, alcohol, methane, any liquid with a boiling point lower than that of the NPM, and may include any low boiling point material that is chemically attached to the NPM, such as Chlorine, Fluorine, and Oxides.

Figure 1A:
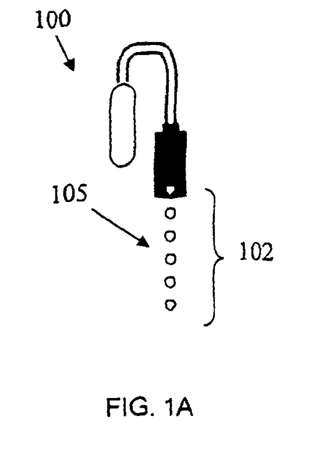
FIG. 1A illustrates a dispenser for dispensing a steady stream of microparticles or micro-droplets.
Figure 1B:
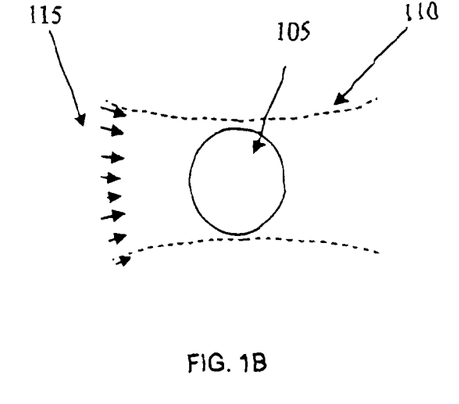
FIG. 1B illustrates a dispensed micro-particle passing through the focus of a lens that focuses the output of a pulsed laser onto the microparticle.
Figure 1C:
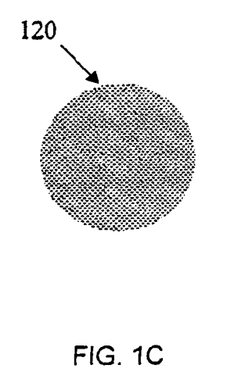
FIG. 1C illustrates the microparticle of FIG. 1B superheated above vaporization of the evaporant material.
Figure 1D:
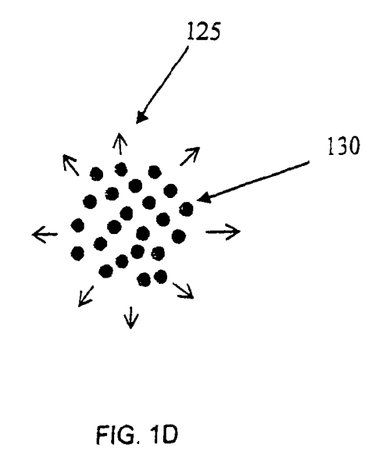
FIG. 1D illustrates the nanoparticles or nano-droplets diffusing outward.
Figure 2:
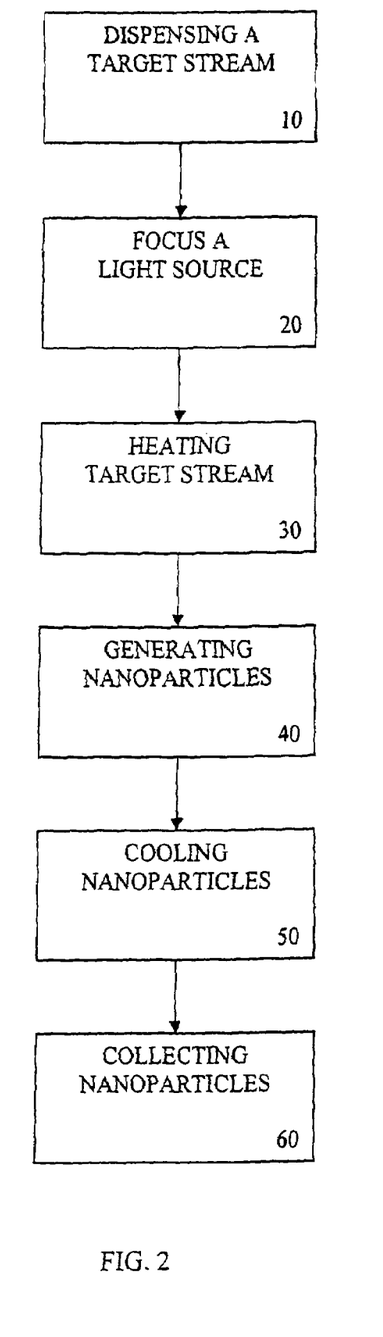
FIG. 2 is a flow diagram of a method of generating nanoparticles from a single microparticle.

FIG. 1A through FIG. 1D illustrates the transformation of the micro-target into nano-droplets or nanoparticles involve stages following the method shown in FIG. 2. A suitable dispenser system 100 is utilized in step 10 to create a steady target stream 102 of micro-targets 105 inside an enclosure as sown in FIG. 1A. In many cases the enclosure will be a vacuum enclosure. The dispenser 100 might be similar to the droplet systems devised for producing our water droplet target, or might be similar to an ink jet dispenser. It might also be a solid material dispenser such as a droplet solder dispenser or some other type of dispenser that produces micro-targets having the two basic constituents, NPM and an evaporant. The size of the micro-targets 105 vary from 1 micron diameter to 500 micron diameter.

In step 20, the target stream of micro-droplets or microparticles 102 is arranged to pass through the focus of a lens 110 that focuses the output of a small pulsed laser 115 onto the micro-target 105 as shown in FIG. 1B. Each micro-target 105 is irradiated in step 30 of FIG. 2, by a pulse of energy 115 from the laser, superheating the micro-targets in the target stream. The energy absorbed from the laser beam heats the materials of the micro-target and the temperature of the micro-target quickly rises above the boiling point of the evaporant, but below that of the NPM. It is estimated that the superheating process occurs over a time of picoseconds to many microseconds.

Only small laser pulse energies are required. For instance, for a 30 micron diameter microparticle, we estimate the laser pulse energy may need to be a few micro joules. When the evaporant material boils into a vapor 120 as shown in FIG. 1C, it starts to explode the micro-target. If the temperature of the micro-target material is now above the melting point of the NPM, then the atoms of this material will coalesce into clusters or small aerosols, nano-droplets 130, while the vapors 120 of the evaporant material will be driven off as gases 125 as shown in FIG. 1D. In step 40 of FIG. 2, the exploding evaporant tends to blow the NPM nano-droplets or nanoparticles 130 outward, away from the focus generating a mist of nano-droplets.

Control of the irradiation conditions (laser pulse energy, pulse duration, wavelength, focal spot size) the microparticle conditions (size, material composition), and the exposure chamber environment, provide control over the size and size-distribution of the nano-droplets or nanoparticles created. The size of the nano-droplets may be determined by simple witness plate detection techniques, or by other techniques known to those skilled in the art.

Figure 3A:
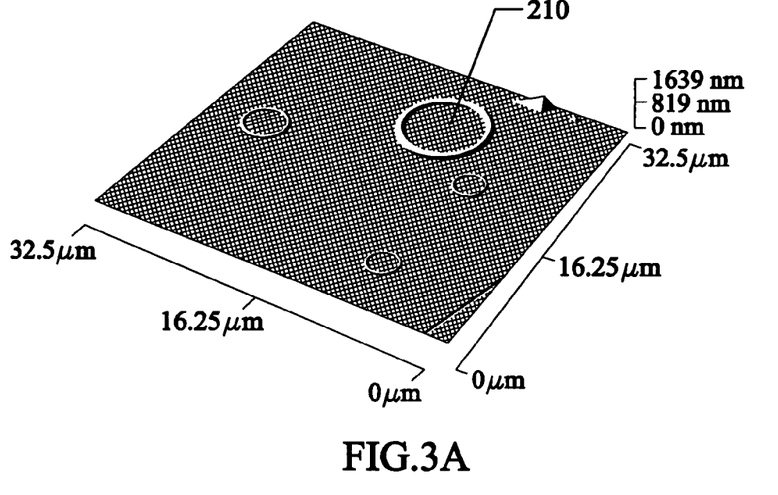
FIGS. 3A, 3B, and 3C show an atomic force microscope image, Auger electron microscope image of individual ring deposits on a witness plate, and scanning electron microscope image of a witness plate, respectively.
Figure 3B:
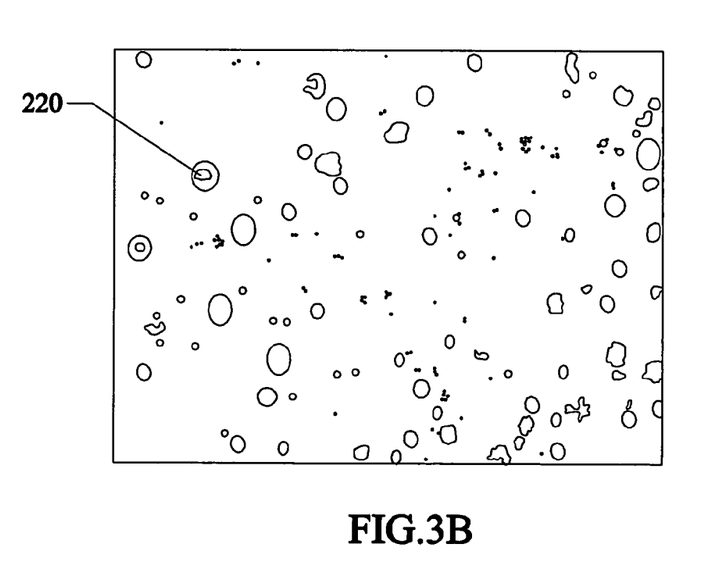
Figure 3C:
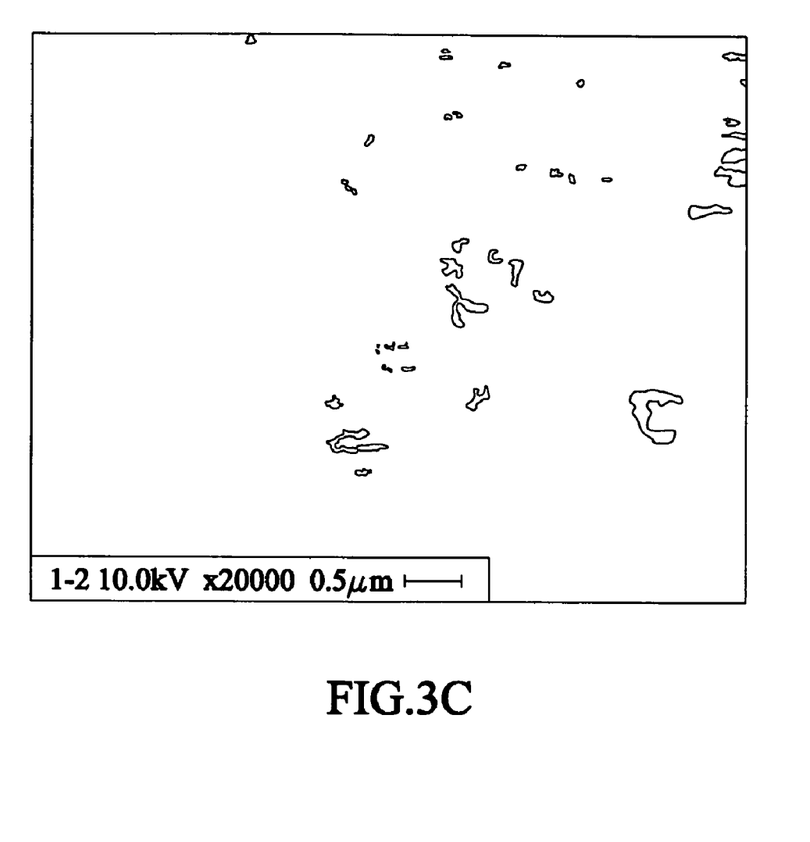

FIGS. 3A, 3B and 3C are examples of a witness plate detector of nano-droplets deposited on planar Silicon witness plates. The micro-target in this case was a 35 micron-diameter liquid droplet/particle (it may freeze by evaporation in the vacuum chamber) comprising of water with a few percent (by atom) doping of a Tin salt. FIG. 3A shows an atomic force microscope (AFM) image of individual ring deposits 210 resulting from the impingement of flying liquid aerosols on the witness plate. FIG. 3B shows an Auger electron micrograph of a similar witness plate. The circular white features 220 are identified by Auger electron spectrometry to be Tin ring deposits, having features similar to those shown in the AFM image of FIG. 3A.

FIG. 3C shows a SEM image of more detailed image of deposits. Measurement of the amount of tin in each deposit indicates that the mass of each tin nanoparticle or nano-droplet is in the range approximately 0.1 femtograms to approximately 10 picograms, and it's diameter in the range of approximately 10 to approximately 1000 nanometers. In this particular example some 1000 or more nanoparticles or nano-droplets were produced from each micro-target irradiated by the laser pulse. The technique produces an isotropically expanding mist of nanoparticles.

Figure 4:
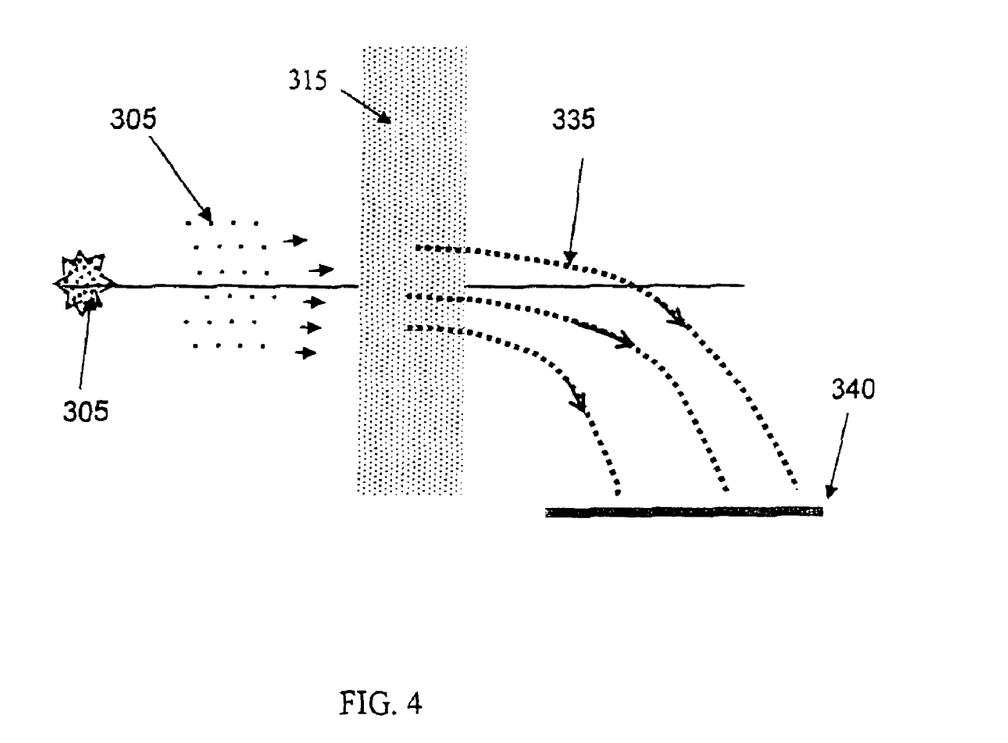
FIG. 4 shows an embodiment of using a gas curtain gaseous cooling environment and cooled droplet collector plate for the generated nano-particle/droplets.

The liquid aerosol nano-droplets shown in FIG. 3 were generated in an enclosure at low vacuum and the nano-droplets generated at the focus of the laser beam could fly through the vacuum without cooling, except by radiative cooling. However, if the enclosure is a partial vacuum, or contains a gas curtain 315 or separate gas enclosure, the liquid nano-droplets 330 are cooled in step 50 of FIG. 2 by collisional cooling to a temperature below their melting point, thereby converting the nano-droplets 330 to small solid nanoparticles 335 as shown in FIG. 4. Then in step 60, a simple plate collector 340 can be used to collect and sort the nanoparticles 335.

This novel nanoparticle generator can improve the efficiency of both laser plasma (LP) and discharge plasma (DP) sources for lithography. By using this mist of nano-droplets as the source material for the plasma in both these source types, high conversion efficiency of laser/discharge energy to approximately 13.5 nm EUV emission can be obtained. Moreover, the nano-droplet number and density can be adjusted so that the nano-droplets are ionized in the plasma. Then the source will be efficient, and the particulate debris is minimized or eliminated. The tin plasma source then offers the advantages of the Xenon source, with the added advantage of a higher conversion efficiency to approximately 13.5 nm EUV emission.

Figure 5A:
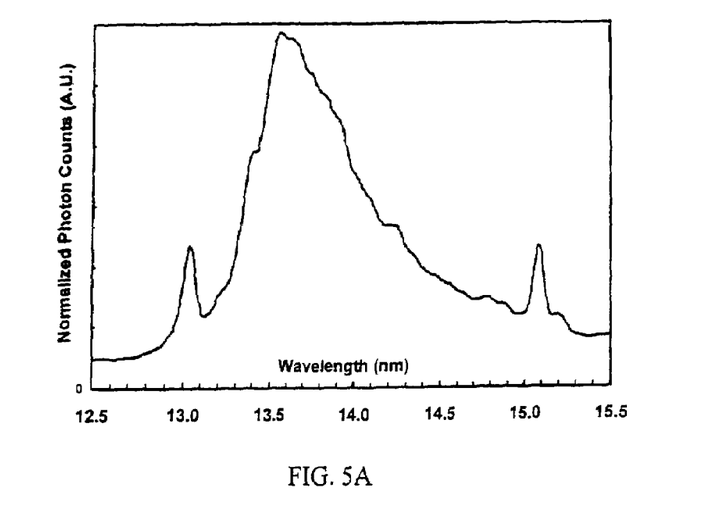
FIG. 5A is a typical electromagnetic spectrum of the light radiated by the plasma created from the laser pulse irradiating the microdroplets, based on tin-chloride ($SnCl_2$) solution.
Figure 5B:
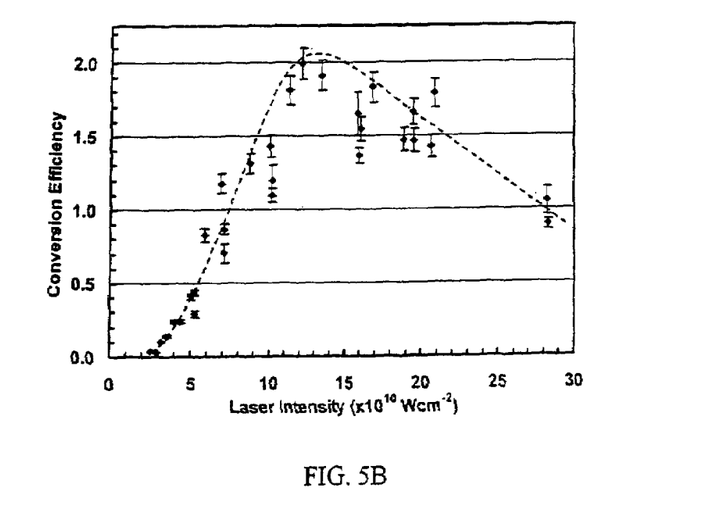
FIG. 5B is an experimental measurement of the intensity dependence of the conversion efficiency (in units of % over $2\pi \times sr$ and within approximately 2% spectral bandwidth at approximately 13.5 nm) of the plasma as a EUV light source.

FIG. 5A is a typical electromagnetic spectrum of the light radiated by the plasma created from the laser pulse irradiating the microdroplets, based on tin-chloride ($SnCl_2$) solution. FIG. 5B is an experimental measurement of the intensity dependence of the conversion efficiency (in units of % over $2\pi \times sr$ and within 2% spectral bandwidth at 13.5 nm) of the plasma as a EUV light source.

While the novel method, apparatus and system for nanoparticle generation is of great importance to the development of intense EUV sources for lithography, one skilled in the art will appreciate that the present invention has alternative applications that are not discussed in this application. The novel method, system and device for nanoparticle generation produces a known flux of particles, dependent on the size of the initial microparticle and the repetition rate of the laser irradiation process. The laser irradiation rate can vary in frequency up to approximately 100 kHz. The laser required for irradiation is small, commercially available, and relatively inexpensive. Variations in the step of the process allow for sized particles to be generated and allows for the capture, or deposition of particles of different materials. The particles are generated by a 'benign' process that is conducive to inclusion in other processing environments and is open to a wide range of materials including those listed in Table 1.

TABLE 1

List of Nanoparticle materials

| Material | Melting point (° C.) | Latent Heat of Fusion (J/g) |
| --- | --- | --- |
| Lithium | 181 | 432 |
| Aluminum | 660 | 396 |
| Antimony | 630 | 165 |
| Arsenic | 613-817 | 370 |
| Astatine | 302 | 114 |
| Barium | 725 | 56 |
| Bismuth | 271 | 52 |
| Cadmium | 321 | 54 |
| Calcium | 840 | 216 |
| Cerium | 799 | 66 |
| Cesium | 29 | 16 |
| Copper | 1083 | 206 |
| Gallium | 30 | 80 |
| Germanium | 937 | 439 |
| Gold | 1064 | 63 |

TABLE 1-continued

List of Nanoparticle materials

| Material | Melting point (° C.) | Latent Heat of Fusion (J/g) |
|---|---|---|
| Indium | 157 | 28 |
| Lanthanum | 921 | 81 |
| Lead | 328 | 23 |
| Magnesium | 649 | 369 |
| Plutonium | 640 | 11 |
| Potassium | 63 | 59 |
| Praseodymium | 931 | 71 |
| Radium | 700 | 37 |
| Rubidium | 39 | 27 |
| Selenium | 217 | 69 |
| Silver | 961 | 105 |
| Sodium | 98 | 113 |
| Strontium | 769 | 105 |
| Sulphur | 113 | 44 |
| Tellurium | 450 | 137 |
| Thallium | 306 | 21 |
| Tin | 232 | 61 |
| Ytterbium | 819 | 53 |
| Zinc | 420 | 114 |

The method, apparatus and system of the present invention generates a known number of nanoparticles of various substances, from a material-specific source, irradiated by a low power pulse laser source. There are a wide number of possible applications for use of the novel method, apparatus and system, ranging from pulse laser deposition (PLD) techniques to the generation of small numbers of nanoparticles across a specific area for biological or biochemical applications.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. An enclosed system for generating flux specific bursts of nanoparticles from a single microparticle, consisting of:
   a source of microparticles of nanoparticle material;
   an enclosure enclosing:
   a disperser system for dispensing a target stream of the microparticles consisting of at least one nanoparticle material selected from a group consisting of Lithium, Aluminum, Antimony, Arsenic, Astatine, Barium, Bismuth, Cadmium, Calcium, Cerium, Cesium, Copper, Gallium, Germanium, Gold, Indium, Lanthanum, Lead, Magnesium, Plutonium, Potassium, Praseodymium, Radium, Rubidium, Selenium, Silver, Sodium, Strontium, Sulphur, Tellurium, Thallium, Tin, Ytterbium, and Zinc combined with an evaporant including at least one liquid selected from a group consisting of water, alcohol, methane and any liquid with a low boiling point from the source;
   a pulse laser source having a variable repetition rate to produce an output;
   a lens coupled with the pulse laser source for focusing the pulse laser source output onto the target stream to heat the target stream of microparticles with the light source to generate flux-specific bursts of nano-droplets of nanoparticles from the heated target stream within the enclosure;
   an environment within the enclosure for cooling the generated nanoparticles to a temperature below their melting point to convert the nano-droplets to solid nanoparticles, the environment selected from one of a partial vacuum, a gas curtain and a separate gas enclosure;
   a collector plate for collecting the solid nanoparticles; and
   a controller for controlling a composition of the bursts of nanoparticles from the heated target stream, the controller varying at least one of a size of the microparticle, a repetition rate of the pulse laser source, the microparticle condition and the environment within the enclosure to control the size and size distribution of the flux of nanoparticles created.

2. The system of claim 1, wherein the controller comprises:
   means for controlling a composition the microparticles in the target stream.

3. An apparatus for generating a flux-specific burst of nanoparticles, the apparatus comprising:
   an enclosure containing:
   a dispenser for dispensing a target stream of microparticles from a source, the microparticles including at least two constituents, a nanoparticle material selected from a group consisting of Lithium, Aluminum, Antimony, Arsenic, Astatine, Barium, Bismuth, Cadmium, Calcium, Cerium, Cesium, Copper, Gallium, Germanium, Gold, Indium, Lanthanum, Lead, Magnesium, Plutonium, Potassium, Praseodymium, Radium, Rubidium, Selenium, Silver, Sodium, Strontium, Sulphur, Tellurium, Thallium, Tin, Ytterbium, and Zinc and an evaporant including at least one liquid selected from a group consisting of water, alcohol, methane and any liquid with a low boiling point;
   a pulsed light source for heating the target stream within the enclosure;
   a lens for focusing the pulsed light source on the target-stream to heat the target stream of microparticles to generate flux-specific bursts of nanoparticles from the heated target stream;
   an environment within the enclosure for cooling the nanoparticles to a melting point to convert the nanoparticles to solid nanoparticles, the environment selected from a partial vacuum, a gas curtain and a separate gas enclosure;
   a collector plate for collecting the solid nanoparticles; and
   a controller to vary at least one of the microparticle size and a repetition rate of the pulsed light source and the environment within the enclosure to control the flux of nanoparticles generated from the heated target stream.

* * * * *